(12) United States Patent
Chu

(10) Patent No.: US 6,639,847 B1
(45) Date of Patent: Oct. 28, 2003

(54) ELIMINATION OF ADDRESS-SENSITIVITY BY SYNCHRONOUS REFERENCE FOR SENSE AMPLIFIER

(75) Inventor: Kwan-Jen Chu, Hsin-chu (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 0 days.

(21) Appl. No.: 10/180,270

(22) Filed: Jun. 26, 2002

(51) Int. Cl.[7] .............................................. G11C 16/04
(52) U.S. Cl. .............................. 365/189.07; 365/189.01
(58) Field of Search ..................... 365/189.07, 185.28, 365/189.01, 185.02, 233, 207, 63, 185.18; 438/257; 327/108

(56) References Cited

U.S. PATENT DOCUMENTS 5,986,967 A * 11/1999 Furumochi et al. ......... 365/233
6,205,071 B1 * 3/2001 Ooishi ........................ 365/207
6,407,941 B1 * 6/2002 Chevallier et al. ............ 365/63
2002/0089876 A1 * 7/2002 Park ..................... 365/185.18

* cited by examiner

Primary Examiner—David Nelms
Assistant Examiner—Thinh T. Nguyen
(74) Attorney, Agent, or Firm—Tung & associates

(57) ABSTRACT

A method and apparatus for stabilizing a sense amplifier utilized in a memory array of a semiconductor integrated circuit. A memory cell of the memory array may be selected, wherein the selected memory cell is associated with a sense amplifier. A cell current associated with the selected memory cell and a reference current associated with a reference memory cell can be generated. Thereafter, the reference current may be synchronized with a plurality of address inputs to eliminate a source line resistance associated with the selected memory cell, thereby resulting in a stabilization the sense amplifier by the elimination of associated address sensitivity.

20 Claims, 5 Drawing Sheets

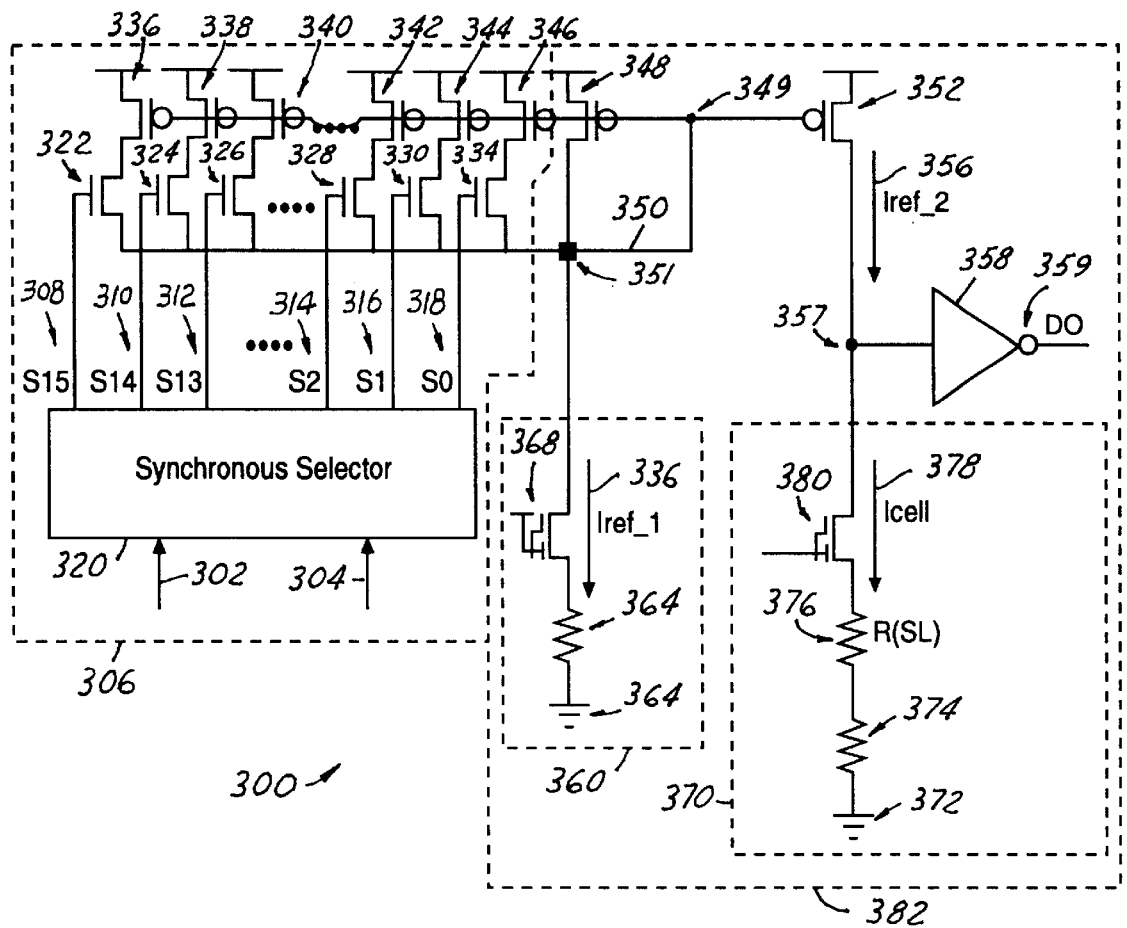
FIG. 3
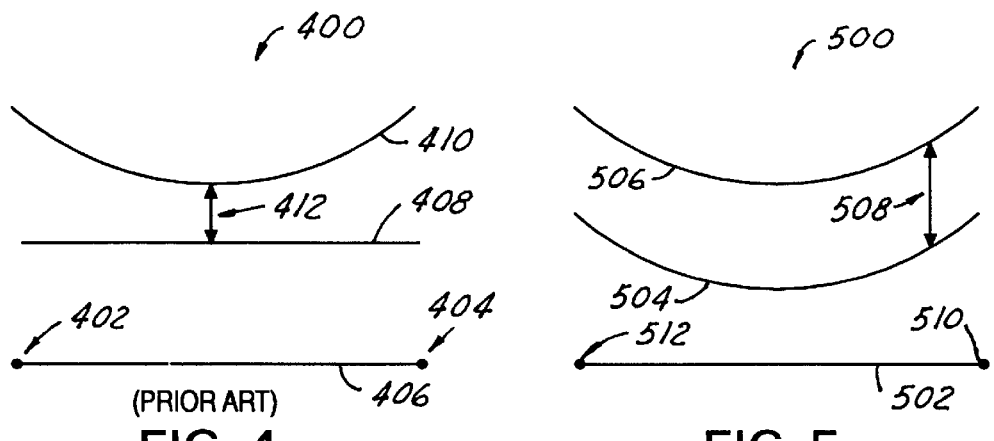
FIG. 4 (PRIOR ART)
FIG. 5

| Input | | | | | | Output | | | | | | | | | | | | | | | |
|---|---|---|---|---|---|---|---|---|---|---|---|---|---|---|---|---|---|---|---|---|---|
| enable | Y4 | Y3 | Y2 | Y1 | Y0 | S15 | S14 | S13 | S12 | S11 | S10 | S9 | S8 | S7 | S6 | S5 | S4 | S3 | S2 | S1 | S0 |
| 0 | x | x | x | x | x | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 0 | 0 | 0 | 0 | 0 | 1 |
| 1 | 0 | 0 | 0 | 0 | 1 | 0 | 0 | 0 | 0 | 0 | 0 | 0 | 0 | 0 | 0 | 0 | 0 | 0 | 0 | 1 | 1 |
| 1 | 0 | 0 | 0 | 1 | 0 | 0 | 0 | 0 | 0 | 0 | 0 | 0 | 0 | 0 | 0 | 0 | 0 | 0 | 1 | 1 | 1 |
| 1 | 0 | 0 | 0 | 1 | 1 | 0 | 0 | 0 | 0 | 0 | 0 | 0 | 0 | 0 | 0 | 0 | 0 | 1 | 1 | 1 | 1 |
| 1 | 0 | 0 | 1 | 0 | 0 | 0 | 0 | 0 | 0 | 0 | 0 | 0 | 0 | 0 | 0 | 0 | 1 | 1 | 1 | 1 | 1 |
| 1 | 0 | 0 | 1 | 0 | 1 | 0 | 0 | 0 | 0 | 0 | 0 | 0 | 0 | 0 | 0 | 1 | 1 | 1 | 1 | 1 | 1 |
| 1 | 0 | 0 | 1 | 1 | 0 | 0 | 0 | 0 | 0 | 0 | 0 | 0 | 0 | 0 | 1 | 1 | 1 | 1 | 1 | 1 | 1 |
| 1 | 0 | 0 | 1 | 1 | 1 | 0 | 0 | 0 | 0 | 0 | 0 | 0 | 0 | 1 | 1 | 1 | 1 | 1 | 1 | 1 | 1 |
| 1 | 0 | 1 | 0 | 0 | 0 | 0 | 0 | 0 | 0 | 0 | 0 | 0 | 1 | 1 | 1 | 1 | 1 | 1 | 1 | 1 | 1 |
| 1 | 0 | 1 | 0 | 0 | 1 | 0 | 0 | 0 | 0 | 0 | 0 | 1 | 1 | 1 | 1 | 1 | 1 | 1 | 1 | 1 | 1 |
| 1 | 0 | 1 | 0 | 1 | 0 | 0 | 0 | 0 | 0 | 0 | 1 | 1 | 1 | 1 | 1 | 1 | 1 | 1 | 1 | 1 | 1 |
| 1 | 0 | 1 | 0 | 1 | 1 | 0 | 0 | 0 | 0 | 1 | 1 | 1 | 1 | 1 | 1 | 1 | 1 | 1 | 1 | 1 | 1 |
| 1 | 0 | 1 | 1 | 0 | 0 | 0 | 0 | 0 | 1 | 1 | 1 | 1 | 1 | 1 | 1 | 1 | 1 | 1 | 1 | 1 | 1 |
| 1 | 0 | 1 | 1 | 0 | 1 | 0 | 0 | 1 | 1 | 1 | 1 | 1 | 1 | 1 | 1 | 1 | 1 | 1 | 1 | 1 | 1 |
| 1 | 0 | 1 | 1 | 1 | 0 | 0 | 1 | 1 | 1 | 1 | 1 | 1 | 1 | 1 | 1 | 1 | 1 | 1 | 1 | 1 | 1 |
| 1 | 0 | 1 | 1 | 1 | 1 | 1 | 1 | 1 | 1 | 1 | 1 | 1 | 1 | 1 | 1 | 1 | 1 | 1 | 1 | 1 | 1 |
| 1 | 1 | 0 | 0 | 0 | 0 | 0 | 1 | 1 | 1 | 1 | 1 | 1 | 1 | 1 | 1 | 1 | 1 | 1 | 1 | 1 | 1 |
| 1 | 1 | 0 | 0 | 0 | 1 | 0 | 0 | 1 | 1 | 1 | 1 | 1 | 1 | 1 | 1 | 1 | 1 | 1 | 1 | 1 | 1 |
| 1 | 1 | 0 | 0 | 1 | 0 | 0 | 0 | 0 | 1 | 1 | 1 | 1 | 1 | 1 | 1 | 1 | 1 | 1 | 1 | 1 | 1 |
| 1 | 1 | 0 | 0 | 1 | 1 | 0 | 0 | 0 | 0 | 1 | 1 | 1 | 1 | 1 | 1 | 1 | 1 | 1 | 1 | 1 | 1 |
| 1 | 1 | 0 | 1 | 0 | 0 | 0 | 0 | 0 | 0 | 0 | 1 | 1 | 1 | 1 | 1 | 1 | 1 | 1 | 1 | 1 | 1 |
| 1 | 1 | 0 | 1 | 0 | 1 | 0 | 0 | 0 | 0 | 0 | 0 | 1 | 1 | 1 | 1 | 1 | 1 | 1 | 1 | 1 | 1 |
| 1 | 1 | 0 | 1 | 1 | 0 | 0 | 0 | 0 | 0 | 0 | 0 | 0 | 1 | 1 | 1 | 1 | 1 | 1 | 1 | 1 | 1 |
| 1 | 1 | 0 | 1 | 1 | 1 | 0 | 0 | 0 | 0 | 0 | 0 | 0 | 0 | 1 | 1 | 1 | 1 | 1 | 1 | 1 | 1 |
| 1 | 1 | 1 | 0 | 0 | 0 | 0 | 0 | 0 | 0 | 0 | 0 | 0 | 0 | 0 | 1 | 1 | 1 | 1 | 1 | 1 | 1 |
| 1 | 1 | 1 | 0 | 0 | 1 | 0 | 0 | 0 | 0 | 0 | 0 | 0 | 0 | 0 | 0 | 1 | 1 | 1 | 1 | 1 | 1 |
| 1 | 1 | 1 | 0 | 1 | 0 | 0 | 0 | 0 | 0 | 0 | 0 | 0 | 0 | 0 | 0 | 0 | 1 | 1 | 1 | 1 | 1 |
| 1 | 1 | 1 | 0 | 1 | 1 | 0 | 0 | 0 | 0 | 0 | 0 | 0 | 0 | 0 | 0 | 0 | 0 | 1 | 1 | 1 | 1 |
| 1 | 1 | 1 | 1 | 0 | 0 | 0 | 0 | 0 | 0 | 0 | 0 | 0 | 0 | 0 | 0 | 0 | 0 | 0 | 1 | 1 | 1 |
| 1 | 1 | 1 | 1 | 0 | 1 | 0 | 0 | 0 | 0 | 0 | 0 | 0 | 0 | 0 | 0 | 0 | 0 | 0 | 0 | 1 | 1 |
| 1 | 1 | 1 | 1 | 1 | 0 | 0 | 0 | 0 | 0 | 0 | 0 | 0 | 0 | 0 | 0 | 0 | 0 | 0 | 0 | 0 | 1 |
| 1 | 1 | 1 | 1 | 1 | 1 | 0 | 0 | 0 | 0 | 0 | 0 | 0 | 0 | 0 | 0 | 0 | 0 | 0 | 0 | 0 | 0 |

ELIMINATION OF ADDRESS-SENSITIVITY BY SYNCHRONOUS REFERENCE FOR SENSE AMPLIFIER

TECHNICAL FIELD

The present invention relates generally to memory arrays and memory cells thereof. The present invention also relates to Random Access Memory (RAM), DRAM, SRAM, and Flash memory devices. The present invention is additionally related to techniques and devices for reading information from a memory. The present invention is also related to cell current address-sensitivity and techniques for stabilizing sense amplifiers utilized in association with memory arrays and memory cells thereof.

BACKGROUND OF THE INVENTION

Several types of memory devices can be provided as internal storage areas in data processing system or computer. As utilized herein, the term "memory" generally refers to data storage configured in the form of integrated circuit chips. Several different types of memory are currently utilized in commercial applications. One type is known as Random Access Memory (RAM). RAM is generally utilized as a main memory in a computer. The acronym RAM generally refers to read and write memory in which data is written into RAM and read from RAM. Such a memory arrangement stands in contrast to ROM, which permits data to be read only. Most RAM is volatile, which means that RAM requires a steady flow of electricity to maintain its contents.

Basic operations of semiconductor memory devices such as dynamic random access memories (DRAMs), static random access memories (SRAMs), and flash memories thus involve reading and writing of data. DRAM (Dynamic Random Access Memory) is a form of semiconductor memory that store information in integrated circuits containing capacitors. Because capacitors lose their charge over time, DRAM boards generally include logic circuits to refresh (i.e., recharge) the DRAM chips continuously. While a DRAM is being refreshed, it cannot be read by the associated processor. If the process must read the RAM while it is being refreshed, one or more wait states may occur. SRAM (Static Random Access Memory) is a form of semiconductor memory based on the logic circuit known as a flip-flop, which retains information as long as there is enough power to run the device.

Dynamic random access memories (DRAMs) are thus data storage devices that store data as a charge on a storage capacitor. A DRAM typically includes an array of memory cells that each include a storage capacitor and an access transistor for transferring charge to and from the storage capacitor. Each memory cell is addressed by a word line and accessed by a bit line. The word line controls the access transistor such that the access transistor controllably couples and decouples the storage capacitor to and from the bit line for writing and reading data to and from the memory cell. The data is read using a differential sensing circuit. Differential sensing is used in different types of DRAM's, including synchronous dynamic random access memory (SDRAM). An SDRAM is a type of DRAM that can run at much higher clock speeds than conventional DRAM memory.

In a typical DRAM complementary bit lines are coupled to a differential sense amplifier During operation, the bit lines are precharged and equilibrated to a common intermediate voltage. It is common to precharge the bit lines to ½ VCC prior to accessing a memory cell. The memory cell is then coupled to one of the bit lines and changes the voltage of the bit line. That is, the charge or lack of charge stored on the memory cell is shared with the charged bit line. The resultant charge will either be increased by a memory cell having a charge, or decreased by an unprogrammed memory cell. The differential voltage level between the complementary bit lines can then be detected and the respective bit lines amplified to either $V_{cc}$ or $V_{ss}$.

The operations that write data vary according to the type of memory, however, the operations that read data are generally similar because of similarities in memory architectures. In a conventional two-dimensional memory architecture, a word line connects to the gates of memory cell transistors in a row of memory cells, and a bit line connects to the sources or drains of the memory cell transistors in a column of memory cells. The operation of reading data in a typical semiconductor memory device is controlled by a signal, referred to as a read enable signal. A memory cell is selected by enabling a word line and a bit line connected to the memory cell. Therefore, reading data from the memory cell is possible only after the word line and the bit line are enabled.

Flash memory is a type of nonvolatile memory utilized widely in the semiconductor arts. In a flash memory, data can be read by sensing the amount of current on a bit line. Therefore, a flash memory utilizes a current sense amplifier, which can sense and amplify the amount of current, to read data in the flash memory. The time taken for sensing the data stored in the memory cell depends on the time required for the sensed current to reach a stable state. For example, in the case where the word line voltage turns on the cell transistor (i.e., the memory cell transistor is erased and has a low threshold voltage), sensing a stable current greater than a predetermined reference current indicates a first data value.

Sensing a stable current less than the reference current (e.g., when the memory cell transistor is programmed to a high threshold voltage) can indicate a second data value. A cell in which the memory cell transistor turns on when the corresponding word line is enabled can be referred to as a turned-on cell. A cell in which the memory cell transistor remains off when the corresponding word line is enabled can be referred to as a turned-off cell. When the word line is enabled late, the speed at which data is sensed is reduced because a longer wait is required before the sensed current stabilizes.

A problem associated with modern memory array configurations, particularly those involving memory devices such as Flash memory, SRAM and DRAM, involves the address-sensitivity of cell currents generated during read operations. During the read operation, the cell current is "address sensitive" because of the existence of a source line resistance between the selected cell and an associated source line strap. Simply put, address sensitivity is due to differences in resistance. The present inventors have thus concluded, based on the foregoing, that a need exists to eliminate the address-sensitivity of the cell current. If this can be accomplished in a cost effective and efficient manner, the stability of the sense amplifier can be guaranteed. Additionally, such a solution would greatly reduce the effort of circuit designers to meet the quick evaluation of flash memory cell performance. The present inventors believe that the invention disclosed herein solves this important need.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved memory array apparatus and method.

It is another aspect of the present invention to provide an improved RAM method and apparatus.

It is yet another aspect of the present invention to provide and improved DRAM method and apparatus.

It is still another aspect of the present invention to provide an improved SRAM method and apparatus.

It is also an aspect of the present invention to provide an improved flash memory method and apparatus.

It is an additional aspect of the present invention to provide an improved method and apparatus for stabilizing sense amplifiers utilized in association with memory arrays and memory cells.

The above and other aspects of the present invention can thus be achieved as is now described. A method and apparatus for stabilizing a sense amplifier utilized in a memory array of a semiconductor integrated circuit is described herein. A memory cell of the memory array may be selected, wherein the selected memory cell is associated with a sense amplifier. A cell current associated with the selected memory cell and a reference current associated with a reference memory cell can be generated. Thereafter, the reference current may be synchronized with a plurality of address inputs to eliminate a source line resistance associated with the selected memory cell, thereby resulting in a stabilization the sense amplifier by the elimination of associated address sensitivity.

The reference current can be synchronized with address inputs utilizing a synchronous selector. A plurality of Y-address inputs are generally connected to the synchronous selector, such that the source line resistance is Y-address sensitive. A read operation to read information from the selected memory cell may be performed, wherein the source line resistance impacts the cell current. Generally a source line is associated with a plurality of memory cells of the memory array. The source line can be configured to include at least one source line strap, such that the at least one source line strap that is based on a particular number of column multiplexers (MUX). The bit lines are generally connected to the source line. The memory array can comprise a Flash memory array, an SRAM array, and/or a DRAM array.

The present invention thus introduces an address-dependent reference current for a sense amplifier and additionally introduces a new algorithm for placing a source line strap according to number of column MUX. In this manner, the stability of the sense amplifier can be assured and the efforts of circuit designers to meeting the rapidly changing needs of flash cell quick performance evaluation can be achieved.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

FIG. 3 depicts a schematic diagram of a sense amplifier design which may be implemented in accordance with a preferred embodiment of the present invention;

FIG. 4 illustrates a high level prior art graph depicting a cell current and a reference current;

FIG. 5 depicts a high level graph depicting a cell current and a reference current in accordance with a preferred embodiment of the present invention;

FIG. 6 illustrates a truth table of a synchronous selector, which may be implemented in accordance with a preferred embodiment of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
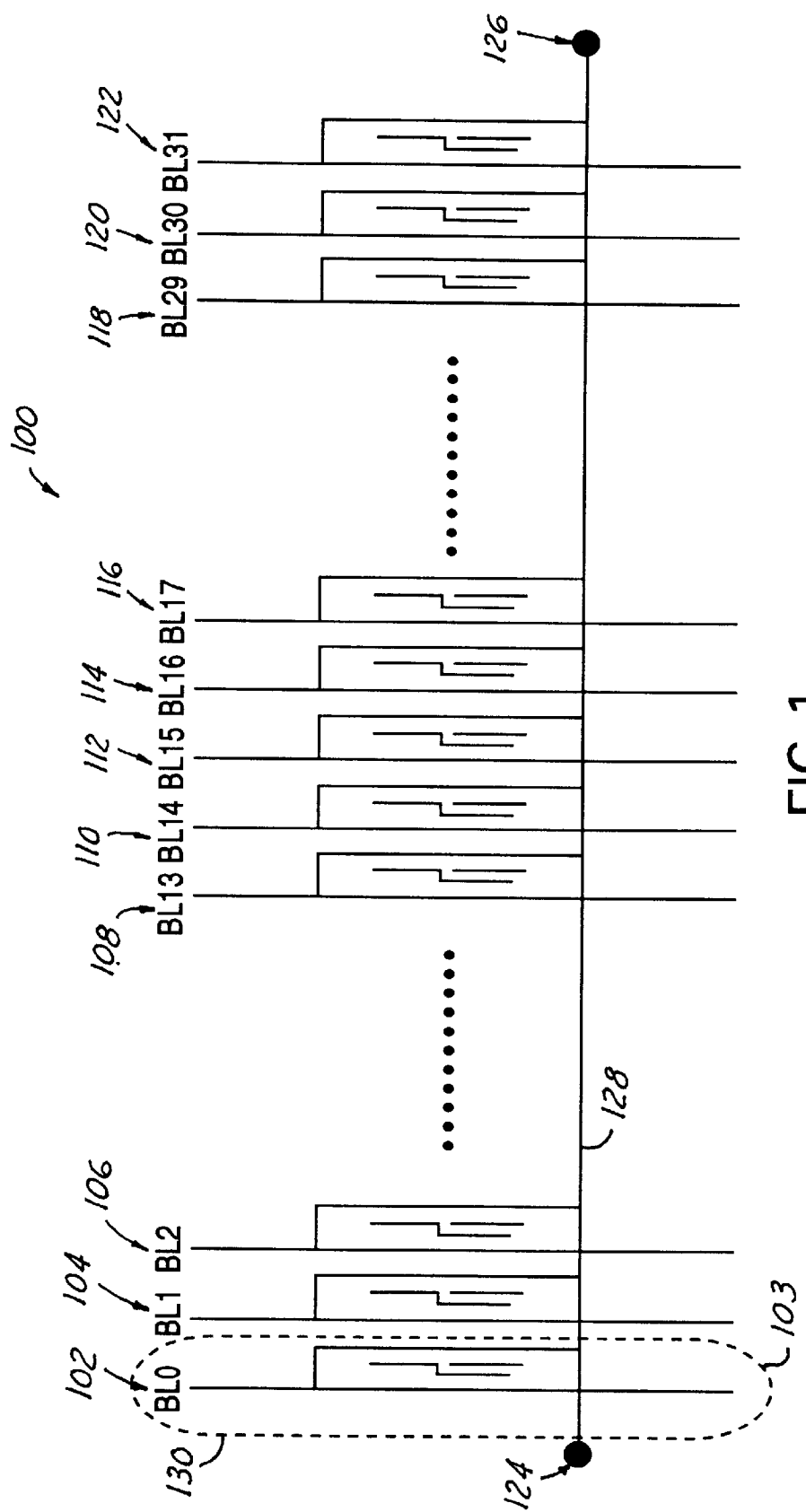
FIG. 1 depicts a schematic diagram of a source line strap located every 32 bit cells, in accordance with a preferred embodiment of the present invention.

FIG. 1 depicts a schematic diagram 100 of a source line strap located every 32 bit cells, in accordance with a preferred embodiment of the present invention. Diagram 100 illustrates a source line 128 and a source line strap 124 and a source line strap 126. A plurality of bit lines are also illustrated in schematic diagram 100, including bit lines 102, 104, and 106, which are respectively labeled BL0, BL1, and B12. Bit lines 108, 110, 112, 114, and 116 and respectively labeled BL13, BL14, BL15, BL16, and BL17. Bit lines 102 through 122 are respectively connected to source line 128. Note that in FIG. 1, a dashed line 103 indicates the outlines of a single memory cell. A plurality of memory cells are illustrated in schematic diagram 100.

Thus, according to the configuration illustrated in FIG. 1, a source line strap (e.g., source line straps 124 and 126) is generally located every 32 bit cells. During a read operation of a memory cell, such as, for example, a memory cell located within the boundaries of dashed line 103, source line 128 experiences a source line resistance which can impact cell current associated with such a memory cell. Note that in FIG. 1, it is assumed that the illustrated memory cells comprise flash memory cells and that such flash memory cells together can form a flash memory array. It can be appreciated by those skilled in the art, however, that other types of memory arrays may also be implemented, such as DRAM, SRAM, and so forth.

Figure 2:
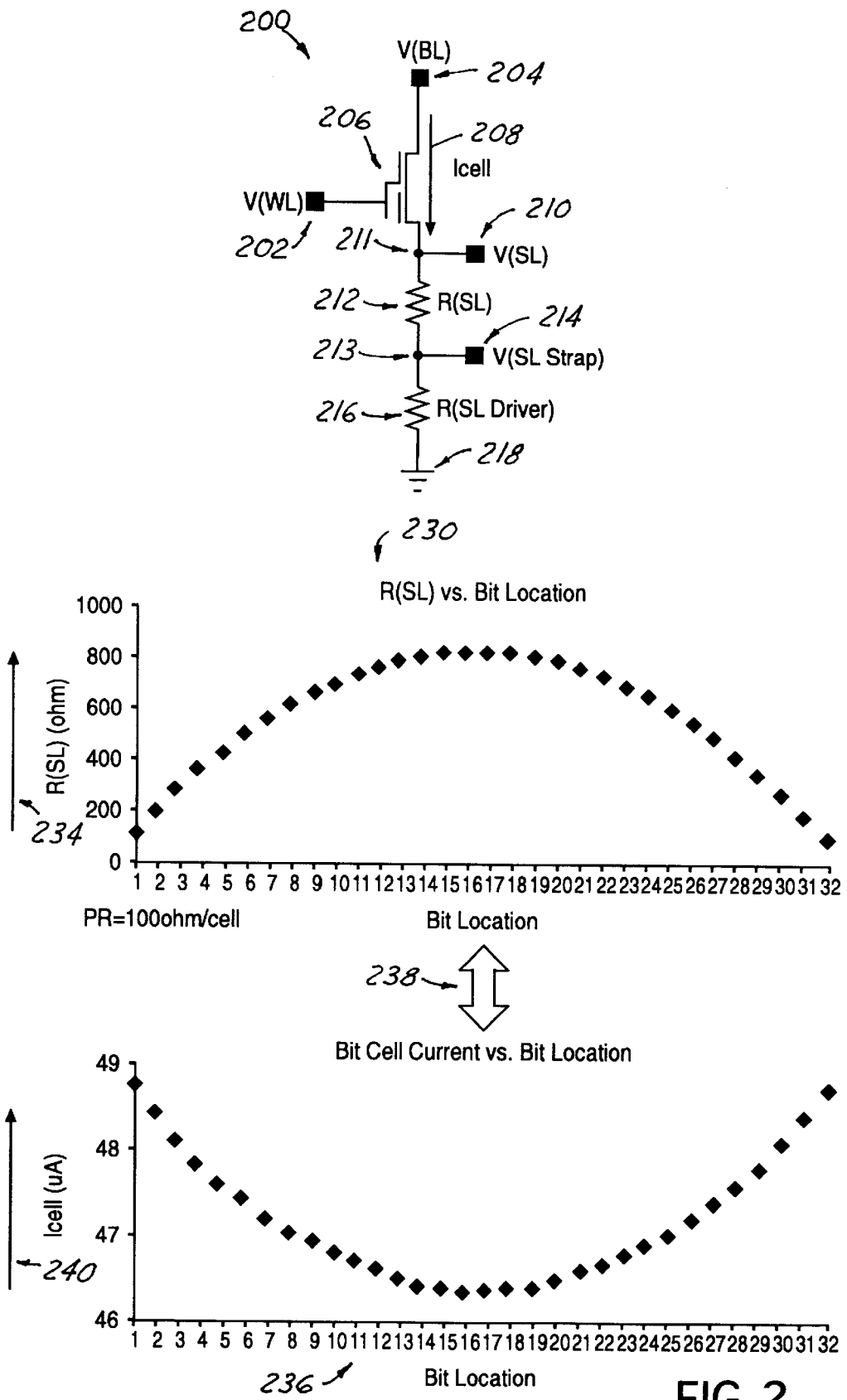
FIG. 2 illustrates a schematic diagram of a simplified memory cell model and graphs illustrating a bit cell current approach in accordance with a preferred embodiment of the present invention.

FIG. 2 illustrates a schematic diagram 200 of a simplified memory cell model and graphs 230 and 236 illustrating a bit cell current approach in accordance with a preferred embodiment of the present invention. Because the source line resistance is "Y address sensitive," the cell current is also address dependent. Recall that in a memory array, during a read operation, the cell current is "address-sensitive," because there exists a source line resistance between the selected cell and the source line strap. Schematic diagram 200 thus illustrates a transistor 206 which is connected to a bit line voltage 204, which is labeled V(BL), and a word line voltage 202, which is labeled V(WL). A cell current 208 is also illustrated, which is transferred by transistor 206 to encounter a resistor 212, which is labeled R(SL) in FIG. 2.

A source line voltage 210, which is labeled V(SL), can be measured at a node 211 located between transistor 206 and resistor 212. Resistor 212 thus comprises a source line resistance. Resistor 212 is further coupled to a resistor 215, which is labeled R(SL Driver). A source line strap voltage 214 can be measured at a node 213, which is located between resistor 212 and resistor 216. Source line strap voltage 214 is labeled V(SL Strap). Resistor 216 is further coupled to a ground 218. Note that resistor 212 comprises a resistance proportional to the distance to the source line strap (e.g., source line straps 124 and 126 of FIG. 1). If resistor 212 is located close to the source line strap, the resistance is smaller. Thus, if a first memory cell is smaller than a second memory cell, the current is larger through the lower resistance. Resistor 214 (i.e., resistance) is Y-address dependent, while, resistor 216 (i.e., resistance) comprises a fixed value.

FIG. 2 also illustrates two sample graphs 230 and 236. Graph 230 comprises a graph of R(SL) versus bit location. As arrow 234 indicates, resistance increases in a range of 0 to 1000 ohms. 32 bit locations are also identified in graph 230. When the resistance is small, the current is thus large, as indicated by arrow 240, which is associated with graph 236. Graph 236 generally comprises a graph of bit cell current versus bit location. Again, 32 bit locations are indicated in graph 236. Arrow 240 indicates an increasing current in a range of 46 to 49 uA. Arrow 240 indicates the cell current.

FIG. 3 depicts a schematic diagram 300 of a sense amplifier design which may be implemented in accordance with a preferred embodiment of the present invention. Schematic diagram includes two circuits 306 and 382, which together comprise a possible implementation of the present invention. Circuit 306 includes a synchronous selector 320, which can receive as input at least one Y-address 302 (i.e., Y ADR [0:4]) and a decoder input (EN). Circuit 306, which is surrounded by dashed lines, can thus be implemented to produce a curved reference current. Circuit 382, which can comprise a conventional reference cell and memory circuit design generally produces a flat or fixed reference current without the presence of circuit 306.

Synchronous selector 320 provides a plurality of output lines 308, 310, 312, 314, 316 and 318, which are respectively connected to a memory array. Such a memory array can be formed from transistors 322, 324, 326, 328, 330, and 334, which are respectively connected to transistors 336, 338, 340, 342, 344, 346, and 348. The memory array is compared to a reference cell 360 at node 351. Reference cell 360 includes a resistor 364 coupled to ground 362 and a transistor 368. A reference current 366, which is labeled Iref_1 is generated which passes through reference 360 to ground 362. A transistor 352 is coupled to transistor 348 at node 349. Synchronous selector 320 thus generally comprises a synchronizing circuit for synchronizing the reference current (i.e., currents 366 and/or current 356) with a plurality of address inputs (i.e., 392) to eliminate a source line resistance associated with the selected memory cell, thereby resulting in a stabilization of amplifier 358 (e.g., a sense amplifier) by the elimination of associated address sensitivity.

A line 350 connects node 351 to transistor 352 at node 349.

A reference current 356 can be generated to pass from transistor 352 to amplifier 358, which can function generally as a sense amplifier. Reference current 356 is labeled Iref_2. Amplifier 358 includes an output 350 and input connected to transistor 352 at node 357. A circuit 370 is connected to amplifier 358 and transistor 352 at node 357. Circuit 370 generally represents a selected cell form the memory array. Circuit 370 thus includes a transistor 380, which is connected to a resistor 376, which is labeled R(SL). Resistor 376 comprises a source line resistor which possesses a source line resistance. Resistor 376 is further coupled to a resistor 374, which stands for the resistor of SL strap and SL driver, and then in turn is connected to a ground 372.

FIG. 4 illustrates a high level prior art graph 400 depicting a cell current 410 and a reference current 408. Reference current 408 represents an ideal reference current provided by a reference-current generator. Due to the curvature of cell current 410 and the generally flat shape of reference current 408, a narrow band 412 is located between cell current 410 and reference current 408. Graph 400 additionally indicates the presence of a source line 406 and source line straps 402 and 404. A disadvantage of the circuit upon which graph 400 is based is that middle cells are easier to tail, because the band 412 is narrow. A working principle of the memory cell is that if the cell current is greater than the reference current, a "1" value can be read. If the opposite occurs, than a "0" value may be read, and so forth.

FIG. 5 depicts a high level graph 500 depicting a cell current and a reference current in accordance with a preferred embodiment of the present invention. Graph 500 represents an improvement over the prior art graph illustrated in FIG. 4. As indicated in graph 500, a cell current 506 follows the same general curvature as a reference current 504. Thus, the band 508 between cell current 506 and 504 is the same throughout the difference between the cell current 506 and reference current 504. Graph 500 also indicates a source line 502 and source line straps 512 and 510. A reference current 504 is thus generated that has the same curvature as the cell current 506, thereby providing a desirable tracking effect. This effect can generally be evidence via an example truth table. FIG. 6 illustrates an example truth table 600 of a synchronous selector, which may be implemented in accordance with a preferred embodiment of the present invention.

Figure 7:
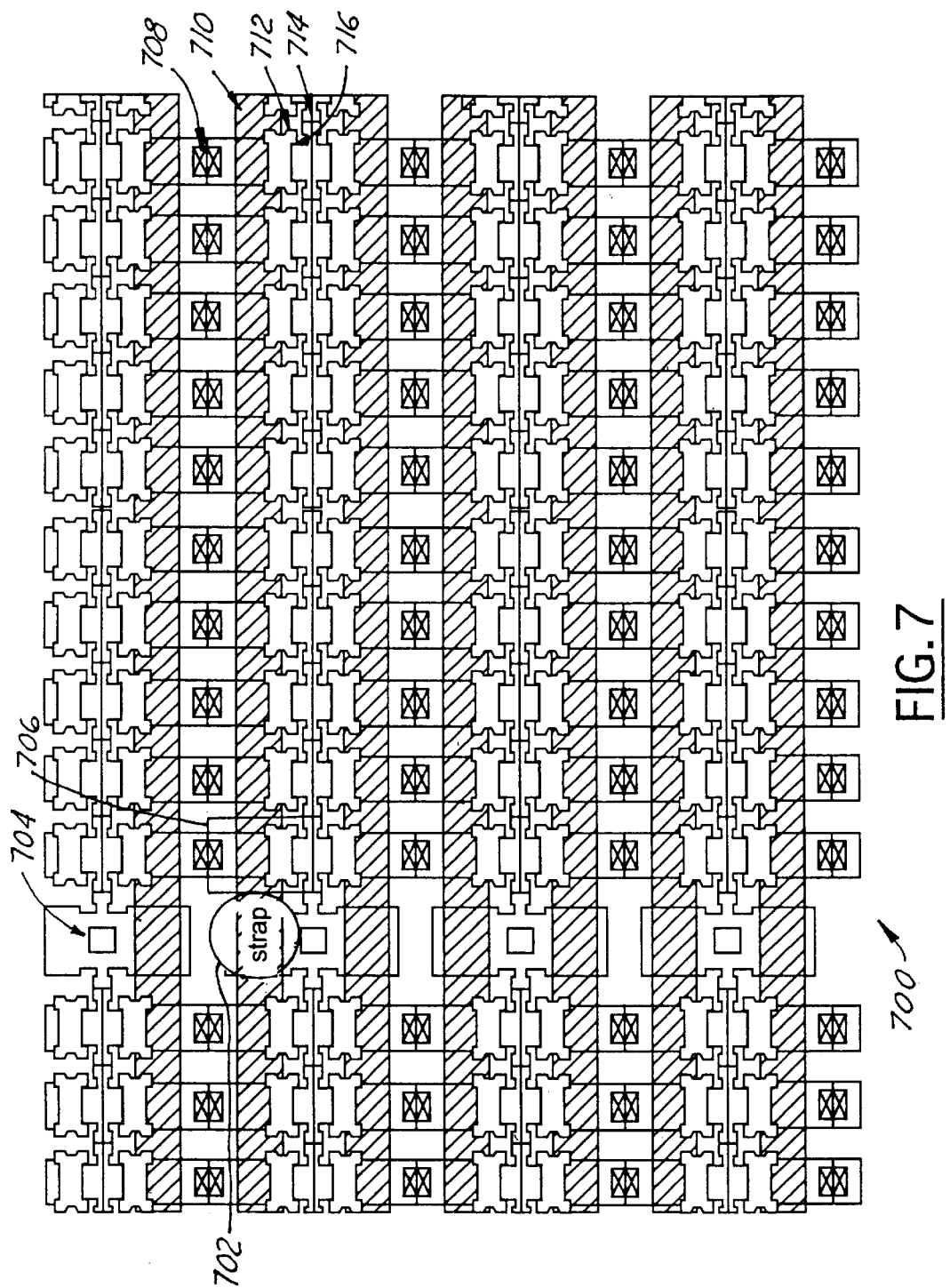
FIG. 7 depicts a top view of a memory array, which may be implemented in accordance with a preferred embodiment of the present invention.

FIG. 7 depicts a top view of a memory array 700, which may be implemented in accordance with a preferred embodiment of the present invention. Memory array 700 represents one possible memory array configuration, which may be implemented in accordance with the present invention. Those skilled in the art can appreciate that a number of variations to this design are possible, in accordance with the invention described herein. Thus memory array 700 includes an example strap 702 located beside an example bit. A source line strap 704 is also illustrated in FIG. 7. Additionally, a source line 714 is indicated adjacent to a floating gate 712 is positioned next to a control gate 710. A drain side connector 708 is indicated above control gate 710. Memory 700 is presented for general illustrative and edification purposes only and is not considered a limiting feature of the present invention.

Based on the foregoing, it can be appreciated that the present invention generally describes a method and apparatus for stabilizing a sense amplifier utilized in a memory array of a semiconductor integrated circuit. A memory cell of the memory array may be selected, wherein the selected memory cell is associated with a sense amplifier. A cell current (e.g., cell current 378 of FIG. 3) associated with the selected memory cell and a reference current (e.g., reference currents 366 and/or reference current 356 of FIG. 3) associated with a reference memory cell (e.g., reference cell 350 of FIG. 3) can be generated. Thereafter, the reference current may be synchronized with a plurality of address inputs (e.g., Y-address 302 of FIG. 3) to eliminate a source line resistance (e.g., resistor 376 of FIG. 3 or resistor 212 of FIG. 2) associated with the selected memory cell, thereby resulting in a stabilization the sense amplifier by the elimination of associated address sensitivity.

The reference current can be synchronized with address inputs utilizing a synchronous selector. A plurality of Y-address inputs are generally connected to the synchronous selector, such that the source line resistance is Y-address sensitive. A read operation to read information from the selected memory cell may be performed, wherein the source line resistance impacts the cell current. Generally a source line is associated with a plurality of memory cells of the memory array. The source line can be configured to include at least one source line strap, such that at least one source line strap that is based on a particular number of column multiplexers (MUX). The memory array can comprise a Flash memory array, an SRAM array, and/or a DRAM array.

The present invention thus introduces an address-dependent reference current for a sense amplifier and additionally introduces a new algorithm for placing a source line strap according to number of column MUX. In this manner, the stability of the sense amplifier can be assured and the efforts of circuit designers to meeting the rapidly changing needs of flash cell quick performance evaluation can be achieved.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for stabilizing a sense amplifier utilized in a memory array of a semiconductor integrated circuit, said method comprising the steps of:
   selecting a memory cell of said memory array, wherein said selected memory cell is associated with a sense amplifier;
   generating a cell current associated with said selected memory cell and a reference current associated with a reference memory cell;
   synchronizing said reference current with a plurality of address inputs to eliminate a source line resistance associated with said selected memory cell, thereby resulting in stabilization of said sense amplifier by the elimination of associated address sensitivity.

2. The method of claim 1 wherein the step of synchronizing said reference current with a plurality of address inputs to eliminate a source line resistance associated with said selected memory cell, further comprises the step of:
   synchronizing said reference current with said plurality of address inputs utilizing a synchronous selector.

3. The method of claim 2 further comprising the step of:
   delivering a plurality of Y-address inputs to said synchronous selector, such that said source line resistance is Y-address sensitive.

4. The method of claim 1 further comprising the step of:
   performing a read operation to read information from said selected memory cell, wherein said source line resistance impacts said cell current.

5. The method of claim 1 further comprising the step of:
   associating a source line with a plurality of memory cells of said memory array.

6. The method of claim 5 further comprising the step of:
   configuring said source line to include at least one source line strap, such that said at least one source line strap is configured according to a particular number of column multiplexers.

7. The method of claim 6 further comprising the step of:
   configuring a plurality of bit lines with said source line.

8. The method of claim 1 wherein said memory array comprises a Flash memory array.

9. The method of claim 1 wherein said memory array comprises an SRAM array.

10. The method of claim 1 wherein said memory array comprises a DRAM array.

11. An apparatus for stabilizing a sense amplifier utilized in a memory array of a semiconductor integrated circuit, said apparatus comprising:
    a selected memory cell of said memory array, wherein said selected memory cell is associated with a sense amplifier, wherein a cell current is associated with said selected memory cell;
    a reference memory cell, wherein a reference current is associated with said reference memory cell; and
    a synchronizing circuit for synchronizing said reference current with a plurality of address inputs to eliminate a source line resistance associated with said selected memory cell, thereby resulting in a stabilization said sense amplifier by the elimination of associated address sensitivity.

12. The apparatus of claim 11 wherein said synchronizing circuit comprises a synchronous selector.

13. The apparatus of claim 12 further comprising the step of:
    a plurality of Y-address inputs coupled to said synchronous selector, such that said source line resistance is Y-address sensitive.

14. The apparatus of claim 11 further comprising:
    read circuit for reading information from said selected memory cell, wherein said source line resistance impacts said cell current.

15. The apparatus of claim 11 further comprising a source line associated with a plurality of memory cells of said memory array.

16. The apparatus of claim 15 wherein said source line comprises at least one source line strap, such that said at least one source line strap is configured according to a particular number of column multiplexers.

17. The apparatus claim 16 further comprising:
    a plurality of bit lines with said source line.

18. The apparatus of claim 11 wherein said memory array comprises a Flash memory array.

19. The apparatus of claim 11 wherein said memory array comprises an SRAM array.

20. The apparatus of claim 11 wherein said memory array comprises a DRAM array.

\* \* \* \* \*